(12) United States Patent
Arita et al.

(10) Patent No.: US 8,133,319 B2
(45) Date of Patent: Mar. 13, 2012

(54) PRODUCTION PROCESS OF PERIODIC TABLE GROUP 13 METAL NITRIDE CRYSTAL AND PRODUCTION METHOD OF SEMICONDUCTOR DEVICE USING THE SAME

(75) Inventors: Yoji Arita, Kanagawa (JP); Yoshinori Seki, Kanagawa (JP); Takeshi Tahara, Kanagawa (JP); Yuzuru Sato, Miyagi (JP)

(73) Assignee: Mitsubishi Chemical Corporation, Tokyo (JP)

( * ) Notice: Subject to any disclaimer, the term of this patent is extended or adjusted under 35 U.S.C. 154(b) by 1210 days.

(21) Appl. No.: 11/631,394

(22) PCT Filed: Jul. 4, 2005

(86) PCT No.: PCT/JP2005/012704
§ 371 (c)(1), (2), (4) Date: Sep. 19, 2007

(87) PCT Pub. No.: WO2006/004206
PCT Pub. Date: Jan. 12, 2006

(65) Prior Publication Data
US 2010/0139551 A1    Jun. 10, 2010

(30) Foreign Application Priority Data
Jul. 2, 2004    (JP) .................................. 2004-196206

(51) Int. Cl.
*C30B 9/04*    (2006.01)

(52) U.S. Cl. ................. 117/74; 117/78; 117/81; 117/82; 117/952

(58) Field of Classification Search .................... 117/74, 117/78, 952, 81, 82, 77
See application file for complete search history.

(56) References Cited

U.S. PATENT DOCUMENTS

| 6,270,569 B1 * | 8/2001 | Shibata et al. ................. 117/68 |
| 6,406,677 B1 * | 6/2002 | Carter et al. ................. 423/276 |

FOREIGN PATENT DOCUMENTS

| CN | 1288079 A | 3/2001 |
| JP | 2005-112718 | 4/2005 |
| JP | 2005 132663 | 5/2005 |
| JP | 2005-239536 | 9/2005 |
| JP | 2005-272258 | 10/2005 |

OTHER PUBLICATIONS

Takuya Goto, et al., "Electrochemical Formation of AlN in Molten LiCl-KCl-Li3N Systems", Electrochimica Acta, vol. 50, pp. 1283-1288, 2005.

(Continued)

*Primary Examiner* — Bob M Kunemund
(74) *Attorney, Agent, or Firm* — Oblon, Spivak, McClelland, Maier & Neustadt, L.L.P.

(57) ABSTRACT

A Periodic Table Group 13 metal nitride crystal is grown by causing a reaction of a Periodic Table Group 13 metal phase with a nitride-containing molten salt phase to proceed while removing a by-product containing a metal element except for Periodic Table Group 13 metals, from the reaction field. According to this process, a high-quality Periodic Table Group 13 metal nitride bulk crystal can be produced under low pressure or atmospheric pressure.

16 Claims, 16 Drawing Sheets

OTHER PUBLICATIONS

Shunro Fuke, et al., "Influences of initial nitridation and buffer layer deposition on the morphology of a (0001) GaN layer grown on sapphire substrates", J. Appl. Phys., vol. 83, No. 2, Jan. 15, 1998, pp. 764-767.

S. Porowski, et al., "Thermodynamical properties of III-V nitrides and crystal growth of GaN at high $N_2$ pressure", Journal of Crystal Growth, vol. 178, 1997, pp. 174-188.

Hisanori Yamane, et al., Preparation of GaN Single Crystals Using a Na Flux, Chem. Mater., vol. 9, No. 2, 1997, pp. 413-416.

Y. T. Song, et al., "Preparation and characterizations of bulk GaN crystals", Journal of Crystal Growth, vol. 260, 2004, pp. 327-330.

Hisanori Yamame, et al., "Special Feature article: Advanced materials processing—for nano- to macro-scale materials", Growth of GaN Single Crystals, Kinzoku (Metals), vol. 73, No. 11, 2003, pp. 1060-1064 (with English translation).

Masuo Shimizu, et al., "Formation of Gallium Nitride by Molten Salt Electrochemical Process", 29-Kai You-Yu En Kagaku Toron-Kai Yoshi Shu (Summary Collection at $29^{th}$ Chemical Discussion on Molten Salt), 1997, pp. 11-12, (with English excerpt).

R. Dwiliński, et al., "GaN Synthesis by Ammonothermal Method", Acta Physica Polonica A, vol. 88, No. 5, 1995, pp. 833-836.

Youting Song, et al., "BULK GaN single crystals: growth conditions by flux method", Journal of Crystal Growth, vol. 247, 2003, pp. 275-278.

* cited by examiner

200 μm

×1000

100 μm
x 450

100 μm
x 450

100 μm
x 450

100 μm
x 450

250 μm

250 μm a

10 μm

10 μm

PRODUCTION PROCESS OF PERIODIC TABLE GROUP 13 METAL NITRIDE CRYSTAL AND PRODUCTION METHOD OF SEMICONDUCTOR DEVICE USING THE SAME

TECHNICAL FIELD

The present invention relates to a production process of a Periodic Table Group 13 (hereinafter simply referred to as Group 13) metal nitride crystal such as GaN crystal, and a method for producing a semiconductor device by using the production process.

BACKGROUND ART

A compound crystal of Group 13 metal and nitride, as represented by gallium nitride (GaN), is useful as a substance for use in light-emitting diodes, laser diodes, high frequency-capable electronic devices and the like. In the case of GaN, the size of the GaN crystal produced by a known method is about 10 mm at present (see, *Oyo Butsuri (Applied Physics)*, Vol. 71, No. 5, page 548 (2002)) and this is insufficient for the application to a semiconductor device. As for the practical production process of a GaN crystal, a method of effecting a vapor phase epitaxial growth on a sapphire substrate or a substrate such as silicon carbide by an MOCVD (metal-organic chemical vapor deposition) process has been proposed (see, for example, *J. Appl. Phys., Vol.* 83, pp. 764-767 (1998)).

However, in the above-described method, the GaN crystal is epitaxially grown on a heterogeneous substrate differing in the lattice constant and thermal expansion coefficient and therefore, many lattice defects are present in the obtained GaN crystal. When such a GaN crystal allowing for the presence of many lattice defects is used, an adverse effect is caused on the activity of the electronic device, and satisfactory performance cannot be expressed for use in the applied field such as blue laser. Therefore, improvement of the quality of GaN crystal grown on a substrate and establishment of the technique for the production of GaN bulk single crystal are being strongly demanded.

At present, in the heteroepitaxial GaN crystal growth method by the vapor phase process, a complicated long step is required so as to decrease the defect concentration of GaN crystal. Therefore, aggressive studies are recently being made on the formation of GaN single crystal, and there have been proposed a high-pressure method of reacting nitrogen and Ga at a high temperature under a pressure (see, *J. Crystal Growth*, 178, page 174 (1997)), a method of reacting Ga and $NaN_3$ while elevating the pressure (see, H. Yamane; *Preparation of GaN single crystals using a Na flux, Chem. Mater.*, pages 413-416 (1997), a flux growth method (see, *Oyo Butsuri (Applied Physics)*, Vol, 71 , No. 5, page 548 (2002); *J. Crystal Growth,* 260, page 327(2004); and *Kinzok (Metals)*, Vol. 73, No.11, page 1,060 (2003), and the like, As for the flux, an alkali metal is often used, but the crystal growth rate is low and only a plate-like crystal having a size of about 10 mm can be obtained. Moreover, many unclear points are remaining, such as crystal growth mechanism or reason why the crystal growth stops at the size of about 10 mm. On the other hand, it has been attempted to produce GaN by oxidizing nitrogen ion on the Ga surface serving as an electrode in a molten salt (see, 29-*Kai You-Yu En Kagaku Toren-Kai Yoshi Shu (Summary Collection at* 29th *Chemical Discussion on Molten Salt)*, page 11 (1997)), but an industrially realizable process is not yet established. Furthermore, a method of synthesizing GaN by an ammonothermal process has been reported (see, *Acta Physica Polonica A*, Vol. 88, page 833 (1995)), but the obtained GaN crystal has a problem, for example, in the crystal size or number of lattice defects and this method is not practiced in industry.

As described above, in the heteroepitaxial crystal growth method on a substrate by a vapor phase process, a Group 13 metal nitride crystal reduced in the lattice defect cannot be obtained. In other methods using a high pressure, the apparatus becomes large-scaled and the profitability is low. In the ammonothermal method using an ammonia in a supercritical state, the apparatus and materials used are very expensive.

DISCLOSURE OF THE INVENTION

The invention has been made to solve those problems in conventional techniques and an object of the invention is to provide a process capable of producing a high-quality Group 13 metal nitride crystal such as GaN crystal under either low pressure or atmospheric pressure.

Another object of the invention is to provide a method for producing a semiconductor device such as light-emitting diode, laser diode and high frequency-capable electronic device, by using the above-described production process.

By taking account of those problems in conventional techniques, the present inventors have made intensive studies on the method for growing a high-quality metal nitride crystal having a crystal size applicable to a semiconductor device by an industrially usable and profitable process, as a result, the invention has been accomplished.

That is, the object of the invention can be attained by the following production process of a Group 13 metal nitride crystal.

[1] A process for producing a Group 13 metal nitride crystal, comprising reacting a liquid phase (A) containing a metal element of Group 13 of the Periodic Table with any one phase (B) of liquid phase (b1), solid phase (b2) and liquid phase (b3) wherein the liquid phase (b1) comprises a molten salt having dissolved therein a nitride containing a metal element except for Group 13 of the Periodic Table, the solid phase (b2) and the liquid phase (b3) comprise a composite nitride containing a metal element of Group 13 of the Periodic Table and a metal element except for Group 13 of the Periodic Table to grow a Periodic Table Group 13 metal nitride crystal, and the reaction is allowed to proceed while removing a by-product containing a metal element except for metals of Group 13 of the Periodic Table, which is produced by the reaction, from the reaction field.

[2] The process for producing a Group 13 metal nitride crystal as described in [1], wherein the by-product is moved in the liquid phase (A) and thereby removed from the reaction field.

[3] The process for producing a Group 13 metal nitride crystal as described in [1] or [2], wherein the liquid phase (A) can be alloyed with the by-product.

[4] The process for producing a Group 13 metal nitride crystal as described in any one of [1] to [3], wherein the liquid phase (A) and the liquid phase (b1) are reacted while maintaining a state that these liquid phases are separated from each other.

[5] The process for producing a Group 13 metal nitride crystal as described in any one of [1] to [4], wherein the liquid phase (A) and the liquid phase (b1) are reacted while allowing for alternate contact with these liquid phases.

[6] The process for producing a Group 13 metal nitride crystal as described in any one of [1] to [3], wherein the liquid phase (b3) is formed between the liquid phase (A) and the solid phase (b2).
[7] The process for producing a Group 13 metal nitride crystal as described in any one of [1] to [6], wherein the by-product is removed from the reaction field through the liquid phase (A) by an electrochemical reaction.
[8] The process for producing a Group 13 metal nitride crystal as described in [7], wherein in the cathode reaction of the electrochemical reaction, the by-product is reacted with a nitrogen gas and thereby converted into a nitride.
[9] The process for producing a Group 13 metal nitride crystal as described in [7], wherein in the cathode reaction of the electrochemical reaction, the by-product is alloyed with a metal element contained in the cathode electrode.
[10] The process for producing a Group 13 metal nitride crystal as described in any one of [1] to [6], wherein the by-product is removed from the liquid phase (A) by reacting the liquid phase (A) with a halogen or halide gas.
[11] The process for producing a Group 13 metal nitride crystal as described in any one of [1] to [6], wherein in the vicinity of the reaction field, the crystal is grown on a seed crystal surface or on a substrate.
[12] The process for producing a Group 13 metal nitride crystal as described in any one of [1] to [11], wherein the Group 13 metal nitride crystal is grown by using a vessel containing magnesium oxide or calcium oxide.
[13] The process for producing a Group 13 metal nitride crystal as described in any one of [1] to [12], wherein the metal element except for Group 13 is an alkali metal or an alkaline earth metal.
[14] The process for producing a Group 13 metal nitride crystal as described in any one of [1] to [5] and [7] to [13], wherein the molten salt is a metal halide.
[15] The process for producing a Group 13 metal nitride crystal as described in any one of [1] to [14], wherein the liquid phase (A) and/or the liquid phase (b1) contains a dopant element.

The another object of the invention can be attained by a method for producing a semiconductor device, comprising a step of producing a Group 13 metal nitride crystal by the production process described in any one of [1] to [15] above.

According to the production process of the invention, a high-quality Group 13 metal nitride bulk crystal can be produced under either low pressure or atmospheric pressure. Particularly, in growing a Group 13 metal nitride crystal by reacting a Group 13 metal alloy with an ionized nitrogen source preferably dissolved in a molten salt or a Group 13 metal, the metal composition in the Group 13 metal alloy is controlled to a constant range in the vicinity of crystal growth interface, whereby a thick film- or bulk-like crystal can be efficiently produced. Therefore, according to the invention, a Group 13 metal nitride crystal having a sufficiently large size for the application to a semiconductor device can be produced by using a reaction vessel made of a refractory material comprising an oxide of alkaline earth metal, Zr, Ti, Y, Ce or the like, particularly, a vessel made of an inexpensive basic refractory material such as magnesium oxide, calcium oxide and zirconia, without passing through a high-temperature high-pressure step as required in conventional techniques.

The production method of a semiconductor device of the invention comprises a step of producing the Group 13 metal nitride crystal of the invention. Therefore, according to the invention, a semiconductor device capable of responding to high frequency can be produced and this provides a great advantage to the industry.

Figure 1:
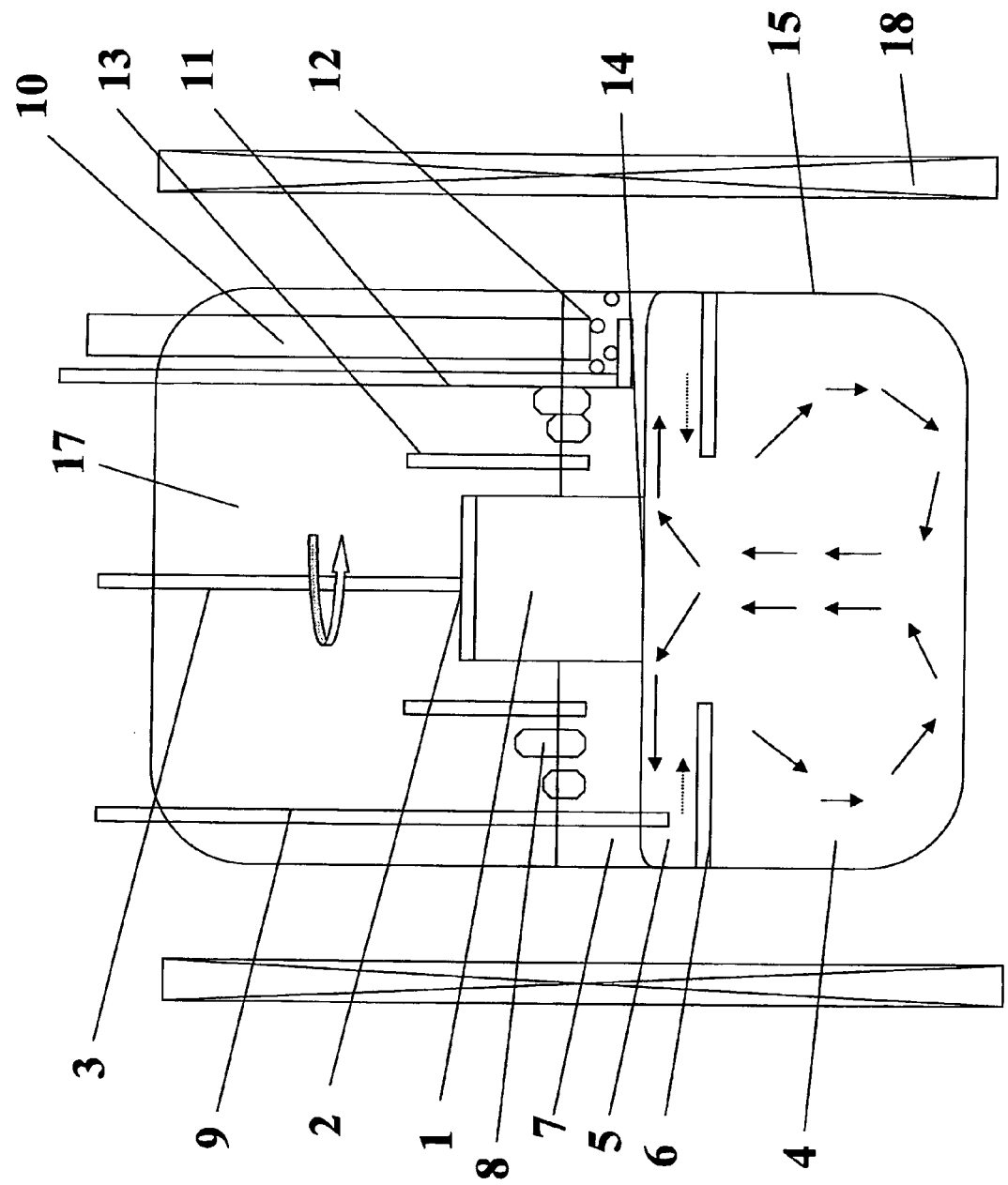
FIG. 1 is a schematic explanatory view showing a crystal growth apparatus (1 of 4) suitably used in the production of the Group 13 metal nitride crystal of the invention.

In the Figures, 1 is a GaN crystal, 2 is a substrate or a GaN crystal, 3 is a substrate supporting bar, 4 is a Ga—Li alloy, 5 is a Ga metal alloy having a high Li concentration, 6 is a partition plate, 7 is a molten salt containing a nitrogen ion source, 8 is an Li$_3$N block or a GaLi$_3$N$_2$ block, 9 is an anode electrode, 10 is a cathode electrode, 11 is a gas inlet tube, 12 is a nitrogen gas, 13 is a solid Li$_3$N partition plate, 14 is a nitride-dissolved phase (a thin film of molten salt having dissolved therein Li$_3$N), 15 is a reaction vessel made of magnesium oxide, 16 is a cathode electrode and a metal (Ga metal) for Li alloy, 17 is a nitrogen gas or an Ar atmosphere, 18 is an electric furnace, 19 is a substrate or a grown crystal, 20 is an alloy-molten salt interface, 21 is a substrate or a crystal-holding/rotating mechanism, 22 is a GaN crystal, 23 is a gas discharge port, 24 is a gas inlet tube, 25 is a purification vessel, 26 is a porous filter, 27 is a sample reservoir, 28 is a hydrogen chloride gas, 29 is an electric furnace for salt purification apparatus, 30 is a reservoir (solid Li$_3$N), 31 is a vessel for a GaLi$_3$N$_2$ solid, 32 is a Ga alloy liquid phase having dissolved therein $GaLi_3N_2$, 33 is a tungsten net, 34 is a substrate for sputtering, 35 is a Ga—Li—N thin film, and 36 is a tungsten partition plate.

BEST MODE FOR CARRYING OUT THE INVENTION

The production process of a Group 13 metal nitride crystal of the invention and the method for producing a semiconductor device by using the production process are described in detail below. In the following, the constitutional requirements are sometimes described based on a representative example of the embodiment of the invention, but the invention is not limited to such an embodiment.

Incidentally, the numerical value range shown by using a word "to" in the present specification means a range including the numerical values set forth before and after "to" as a lower limit value and an upper limit value, respectively. Also, the term "substrate surface" as used in the present specification includes not only the surface of a substrate such as sapphire, SiC and ZnO, but also the surface of the formed Group 13 metal nitride crystal. Furthermore, the "reaction field" means the vicinity of interface between the liquid phase (A) containing a metal element of Group 13 and any one phase (B) of a liquid phase (b1) comprising a molten salt having dissolved therein a nitride containing a metal element except for Group 13 and a solid phase (b2) or liquid phase (b3) comprising a composite nitride containing a metal element of Group 13 and a metal element except for Group 13. In the reaction field, the component of each phase diffuses to other phase from one another and thereby a reaction proceeds. The liquid phase (b3) may be formed as a result of partial dissolution of the solid phase (b2).

[Production Process of Group 13 Metal Nitride Crystal]

The production process of the invention is characterized in that the reaction of a liquid phase (A) containing a metal element of Group 13 with any one phase (B) of a liquid phase (b1) comprising a molten salt having dissolved therein a nitride containing a metal element except for Group 13 and a solid phase (b2) or liquid phase (b3) comprising a composite nitride containing a metal element of Group 13 and a metal element except for Group 13 is allowed to proceed while removing a by-product containing a metal element except for Group 13 metals, which is produced by the reaction, from the reaction field, thereby growing a Group 13 metal nitride crystal.

The liquid phase (A) containing a metal element of Group 13 is preferably a liquid-state Group 13 metal alloy phase. The Group 13 metal alloy for use in the production process of the invention comprises a metal element of Group 13 and a metal element except for Group 13. Preferred examples of the Group 13 metal include Ga, Al, In, GaAl and GaIn. Examples of the metal element except for Group 13 include Li, Na, Ca and Mg, and among these elements, Li and Ca are preferred. Specific preferred examples of the Group 13 metal alloy include a Ga—Li alloy and a Ga—Ca alloy.

In the production process of the invention, the nitride used in the phase (B) serves as the nitrogen source at the time of growing a Group 13 metal nitride crystal. This nitride is a nitride of the metal element except for Group 13, or a composite nitride of the Group 13 metal with the metal element except for Group 13. Preferred examples of the nitride include $Li_3N$, $Ca_3N_2$, $GaLi_3N_2$ and $Ca_3Ga_2N_4$. Such a nitride can be used by dissolving it in a molten salt or in a Group 13 metal.

In the invention, the nitride-containing liquid phase can be reacted with a liquid phase which is a phase of the above-described Group 13 metal or an alloy thereof. In this case, even when a Group 13 metal in the form of a simple body is used as the reacting material, a Group 13 metal alloy phase is produced along the progress of reaction. The nitride-containing liquid phase is not particularly limited as long as it reacts with a Group 13 metal alloy, but is preferably a liquid phase obtained by dissolving a nitride in a molten salt which is an ionic melt, or in a Group 13 metal. Particularly, a molten salt or Group 13 metal in which nitride is saturated is preferred, and specific examples thereof include a liquid phase obtained by mixing excess $Li_3N$ with a molten salt of alkali halide and allowing for coexistence of solid $Li_3N$ so as to keep the saturated solubility. When such a liquid phase having a small surface tension is used, intrusion into the interface between the Group 13 metal nitride crystal and the Group 13 metal alloy can be facilitated.

Also, in the invention, the nitride can be directly contacted with a Group 13 metal to form a nitride-dissolved liquid phase in the vicinity of interface of the Group 13 metal and allow for reaction with the Group 13 metal alloy phase in the inside. In the case of dissolving the nitride in a Group 13 metal, when the nitride is a simple body of $Li_3N$ or $Ca_3N_2$, a composite nitride such as $GaLi_3N_2$ and $Ca_3Ga_2N_4$ is considered to be produced from the chemical equilibrium with Ga metal or produced GaN. Therefore, it is also a preferred method to use a composite nitride such as $GaLi_3N_2$ and $Ca_3Ga_2N_4$ from the beginning as the nitrogen source of reaction. This nitride may not be a chemically synthesized crystalline nitride but may be, for example, a mixed nitride film deviated from the stoichiometric composition, which is produced on a sapphire substrate or a vitrified substrate such as quartz by reactive sputtering or the like. The nitride thin film formed by such a dry process is particularly preferred, because when the nitride thin film is kept in contact with a Group 13 metal, the nitride gradually dissolves out from the nitride thin film into the Group 13 metal and a diffusion-governing nitride-dissolved phase can be formed in the vicinity of interface. Furthermore, the alloy component element (e.g., Li, Ca) expelled into the Group 13 metal alloy by the reaction is generally small in the density than the Group 13 metal and therefore, such an element is preferably caused to undertake a reaction in the lower part of the Group 13 metal alloy and exit from the reaction field owing to difference in the density, so that the element can swiftly diffuse into the Group 13 metal alloy from the reaction field.

In the case of practicing the invention by using a molten salt, the molten salt used is not particularly limited in its kind as long as it does not inhibit the progress of a reaction between the Group 13 metal and the nitrogen ion source, and examples thereof include a halide, a carbonate, a nitrate and a sulfide. Among these, a halide is preferred because this is stable and ensures high solubility of nitride. The molten salt is more preferably a compound which is a salt containing an alkali metal and/or an alkaline earth metal and is used for a production reaction of nitrogen ion source.

From these standpoints, the molten salt is preferably an alkali metal salt (e.g., Li, Na, K) and/or an alkaline earth metal salt (e.g., Mg, Ca, Sr), more preferably an alkali metal salt, still more preferably an Li salt. Furthermore, the molten salt is also preferably a metal halide such as LiCl, KCl, NaCl, $CaCl_2$, $BaCl_2$, CsCl, LiBr, KBr and CsBr, more preferably LiCl, KCl, NaCl, CaCl or a mixed salt thereof.

In the case where impurities such as water are contained in the molten salt, the molten salt is preferably purified in advance by blowing a reactive gas. Examples of the reactive gas include hydrogen chloride, hydrogen iodide, hydrogen bromide, ammonium chloride, ammoniumbromide, ammonium iodide, chlorine, bromine and iodine. For the chloride molten salt, hydrogen chloride is particularly preferred.

In the production process of the invention, the nitride-containing liquid phase is reacted by contacting it with a phase of the above-described Group 13 metal or an alloy thereof. At this time, a Group 13 metal nitride crystal or a substrate is preferably used as a seed crystal for the crystal growth. The seed crystal is not particularly limited in its shape and may have a plate-like form or a bar-like form. Also, the seed crystal may be a seed crystal for homoepitaxial growth or a seed crystal for heteroepitaxial growth. Specific examples thereof include a vapor-grown Group 13 metal nitride seed crystal such as GaN, InGaN and AlGaN. Furthermore, a metal oxide such as sapphire, silica, ZnO and BeO, a silicon-containing material such as SiC and Si, or a material such as GaAs or the like used as a substrate in, for example, the vapor phase growth, may also be used. As for the material of such a seed crystal or substrate, a material having a lattice constant as close as possible to the lattice constant of the Group 13 metal nitride crystal grown by the invention is preferably selected. In the case of using a bar-like seed crystal, it is also possible to produce a bulk crystal by performing growth first in the seed crystal portion, then performing crystal growth mainly in the horizontal direction, and thereafter performing crystal growth in the perpendicular direction. At the time of performing crystal growth in the horizontal direction, the Group 13 alloy is preferably controlled to have a composition distribution in the horizontal direction so that the crystal growth can stop at an appropriate portion before reaching the side wall of the vessel.

In the invention, when a Ga—Li alloy is used as the Group 13 metal alloy and lithium nitride or gallium lithium nitride is used as the nitrogen source, the reaction is fundamentally represented, for example, by the following formulae:

$$Ga + Li_3N = GaN + 3Li \qquad (1)$$

$$Ga + GaLi_3N_2 = 2GaN + 3Li \qquad (1)'$$

It is conventionally known to produce a GaN crystal by dissolving GaN powder or GaN fine crystal together with Ga metal, lithium metal, lithium nitride or the like in a crucible (see, Chinese Unexamined Published Patent Application No. 1288079A). However, in conventional techniques, the Ga metal, Li metal, lithium nitride, GaLi nitride or the like is considered to be a solubilizing agent for dissolving the GaN powder or GaN fine crystal and therefore, these are mixed in the same crucible and left standing. At this time, a molten salt is not used in the reaction field. The crystal obtained in this way is only a thin plate-like crystal having a size of 5 to 10 mm at the largest. In the system where a reacting material and a produced material are mixed together or dissolved with each other, the reason why the crystal which can be obtained is only a small crystal is very difficult to elucidate.

The Li metal produced in reaction formula (1) or (1)' dissolves in the Ga metal which is one of reaction sources, but as the reaction proceeds, the Li metal concentration in the Ga metal elevates and the reaction of formula (1) or (1)' reaches equilibrium and stops. The present inventors considered that because of such stopping, the crystal grows at a low rate and only a small crystal is obtained in conventional techniques, and have succeeded in developing the invention having means of solving this problem.

In the invention, the Ga metal as a reaction source and $Li_3N$ or $GaLi_3N_2$ dissolved in the molten salt or in the Ga metal are respectively constituting different liquid phases, and the Li metal produced according to reaction formula (1) or (1)' dissolves in the Ga metal which is one of reaction sources. As the reaction proceeds, the Li metal concentration in the Ga metal increases, but when the concentration of the Li metal which forms an alloy with the Ga metal is controlled by some means, for example, using absorption of the Li metal on the production system side to the Ga alloy on the reaction system side, the reaction of formula (1) or (1)' can always proceed to the right side. The density of the Li metal produced by the reaction is smaller than that of the Ga metal and therefore, when the reaction portion with nitride is arranged to the lower part of the Ga metal, the Li metal moves toward the upper direction in the Ga—Li alloy and the Li concentration becomes high in the upper part. More specifically, the Li metal moves toward the upper direction in the Ga—Li alloy in the vicinity of reaction part, that is, the Li concentration in the Ga—Li alloy in the vicinity of reaction part can be naturally controlled. Then, Li of which concentration is increased in the upper part is removed by some technique. In one method, Li is removed from the Ga metal alloy phase by an electrochemical process or the like, whereby the composition of the Ga metal alloy phase can be kept to a constant range and the reaction of formula (1) or (1)' can be continuously performed.

When a metal salt containing a nitrogen source is buoyed on a liquid of Group 13 metal having a low melting point, such as Ga, and a seed crystal is placed on the Ga metal, the molten salt intrudes between the seed crystal surface and the liquid Ga metal to form a thin film-like nitride-dissolved phase, whereby crystal growth can be performed. As the crystal grows, the alkali metal element (Li) which is a reaction product dissolves in the liquid Ga metal and becomes an alloy. As for the method of removing the alkali metal element (Li) at this time, for example, a method of anodically dissolving the liquid Ga alloy, thereby dissolving the alkali metal element in the form of Li ion in the molten salt, and on the cathode side in the bath, using a metal alloyable with Li, such as Ga or Al, to act as the cathode electrode, can be employed whereby Li can be easily recovered. Other than the electrochemical method, a method of transferring the Group 13 metal alloy to a different reaction vessel and after adjusting the composition there, returning it to the reactor for the crystal growth may also be employed. Furthermore, a method of introducing the Group 13 metal alloy increased in the Li metal concentration into a different vessel, and reacting a halogen or halide gas therewith to produce an Li halide, maybe employed. The produced Li halide readily dissolves in the molten salt.

In the invention, the composition of the Ga metal alloy phase near the reaction field is controlled to fall within a constant range by employing such a method, so that the reaction of formula (1) or (1)' can be continuously performed. The term "within a constant range" as used herein means that the fluctuation width of the Ga content in the Ga metal alloy phase is within ±25 atm %, preferably within ±10 atm %, more preferably within ±5 atm %.

In this way, the composition of the Group 13 metal alloy phase is controlled within a constant range in the vicinity of growth interface of the Group 13 nitride crystal, whereby a thick film- or bulk-like Group 13 metal nitride crystal can be grown. The quality of the Group 13 nitride crystal obtained by the invention is also governed by the reaction speed which is thus controlled. The reaction rate varies depending on the concentration of the Li metal forming an alloy with the Ga metal and therefore, the alloy composition is also preferably selected to take an optimal value.

In the invention, the reaction of the Group 13 metal and the nitrogen source is performed at the liquid phase interface or on the substrate surface, and the reaction temperature is usually from 200 to 1,000° C., preferably from 400 to 850° C., more preferably from 600 to 800° C.

In the invention, when the nitrogen source is used by dissolving it in the molten salt, the nitrogen source compound can be used at a temperature lower than its melting point. Furthermore, when the nitrogen source is charged in excess, this is preferred because the concentration in the molten salt keeps the saturated solubility and the activity of $Li_3N$ or $GaLi_3N_2$ in formula (1) or (1)' becomes 1. This is also preferred because the molten salt and the Group 13 metal alloy are present as completely different phases, the reaction at the interface therebetween proceeds uniformly and the reaction rate is accelerated. In the case of forming the nitride-dissolved phase in the Group 13 metal, a nitride solid is preferably contacted with the Group 13 metal, so that a liquid phase having dissolved therein nitride can be formed at the interface as a result of dissolution or natural diffusion from the contact portion and the shape of this phase cannot be disturbed by convection or the like. In the case of using a substance except for Group 13 metals for the purpose of doping, this can be attained within the production step of the invention by adding the substance to the molten salt or Group 13 metal alloy.

The powder used as the nitrogen source, such as $Li_3N$, has hygroscopicity and when used as a raw material, the powder readily absorbs moisture or the like. Therefore, in view of preventing mingling of impurities such as moisture from the outside of reaction system, the powder is preferably used after $Li_3N$ is previously melted under heat in a crucible-or the like and then solidified.

$GaLi_3N_2$ can be produced by sintering GaN and $Li_3N$ at about 800° C. or by heat-treating a Ga—Li alloy at 600 to 800° C. in a nitrogen atmosphere. $GaLi_3N_2$ can be used alone but may be used as a mixture with $Li_3N$. By using as a mixture, melting in the molten salt or Ga alloy is facilitated. Furthermore, a mixed composition thin film of Li—N or Ga—Li—N may be formed by reactive sputtering using a nitrogen plasma with the target being an Li metal or a Ga—Li alloy and used in substitution for $Li_3N$ or $GaLi_3N_2$. This is not only prosperous for producing a thin film-like crystal but also advantageous in that even a material system difficult to chemically synthesize, for example, a material such as composite nitride of Ga—Na, can be produced.

The Group 13 metal nitride crystal obtained by the production process of the invention is a nitride of single metal (for example, GaN, AlN or InN) or a nitride of synthetic composition (for example, GaInN or GaAlN), and this production process can be suitably used in particular as a production process of GaN crystal. The crystal growth of the Group 13 metal nitride is preferably performed by using a seed crystal or growing the crystal on a substrate.

Figure 4:
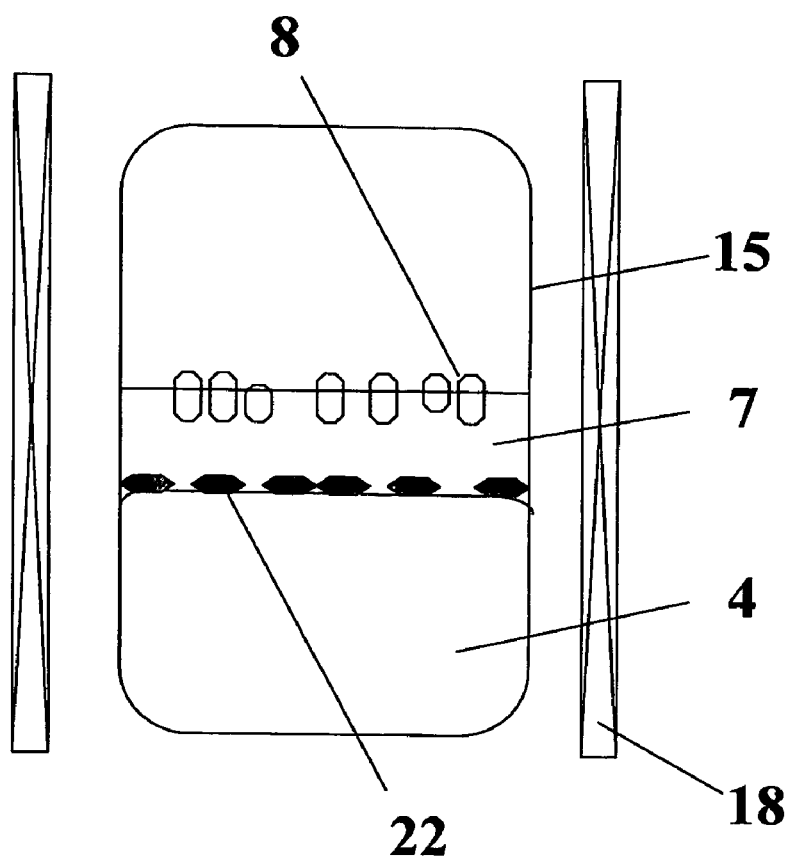
FIG. 4 is a schematic explanatory view showing a crystal growth apparatus used in Examples.
Figure 5:
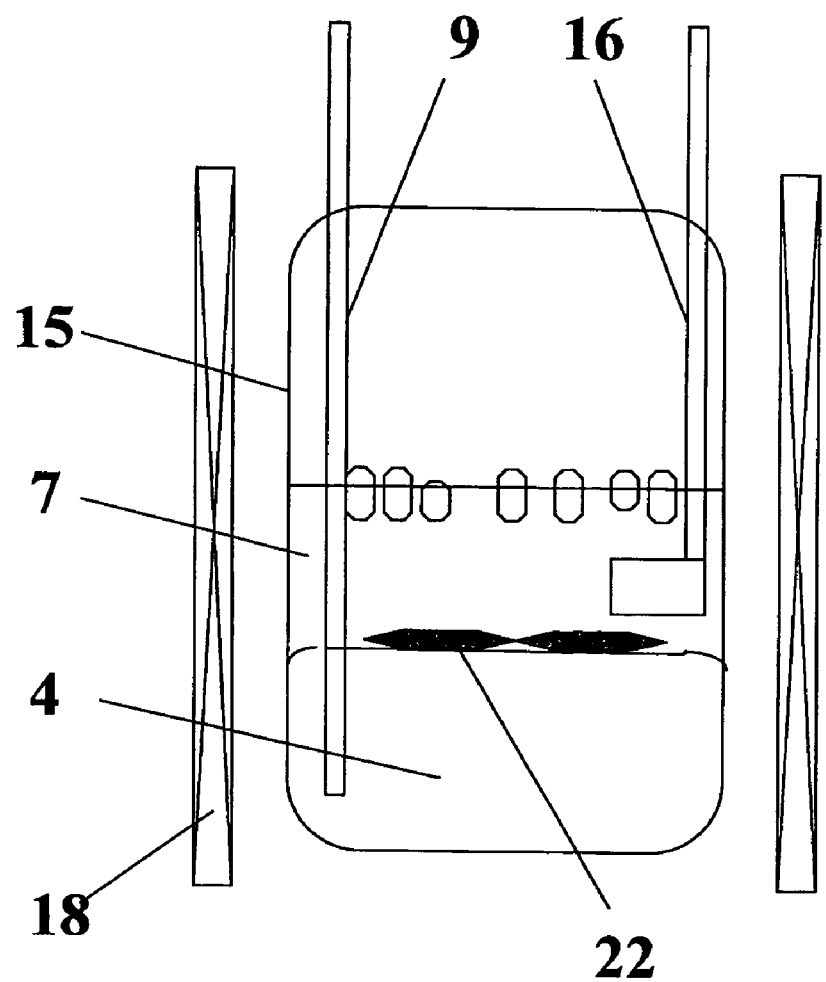
FIG. 5 is a schematic explanatory view showing a crystal growth apparatus with electrode used in Examples.
Figure 6:
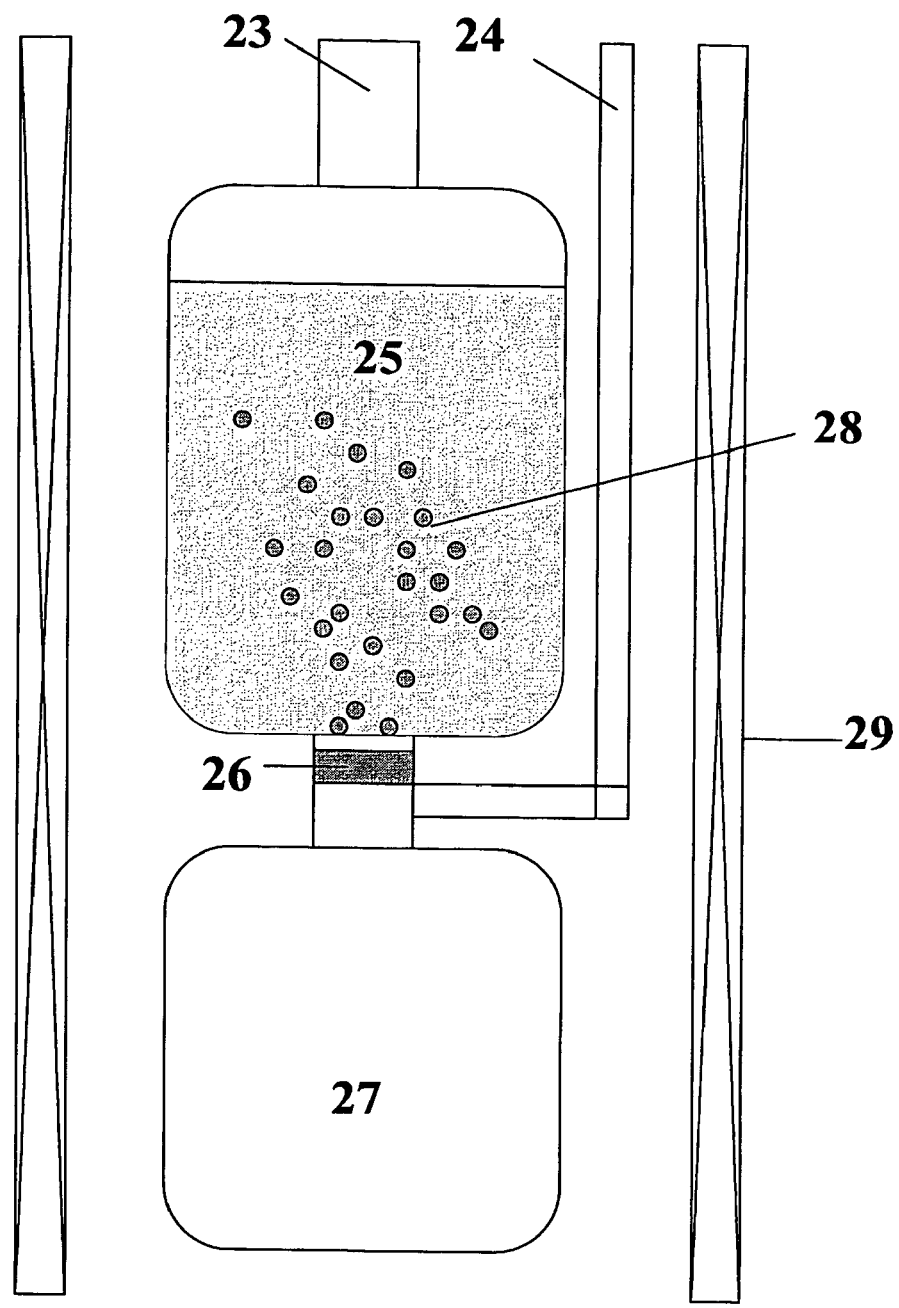
FIG. 6 is a schematic explanatory view showing one embodiment of a molten salt-purifying apparatus used in Examples.

The production process of the invention is described in greater detail by referring to the drawings. FIGS. 1, 2, 3, 13 and 14 each is a view showing a construction example of the production apparatus for growing the Group 13 metal nitride crystal, which is used in practicing the invention. FIGS. 4, 5 and 15 each is a view showing the apparatus used in Examples of the invention. FIG. 6 is a schematic explanatory view of the purification apparatus for the molten salt, and the molten salt for use in the crystal growth is preferably purified (mainly dehydration) in advance by this apparatus.

The molten salt such as chloride generally contains a large amount of moisture due to its strong hygroscopicity. If a molten salt containing moisture is used in practicing the invention, an oxide of the Group 13 metal is formed in the reaction vessel to readily cause corrosion of the reaction vessel and therefore, this is not preferred. Accordingly, impurities such as water are preferably removed in advance by using a sample encapsulating type pre-treatment apparatus shown in FIG. 6 (see, *Yoyu En, Netsu Gijutsu no Kiso (Molten Salt, Fundamentals of Thermal Technology)*, Agne Gijutsu Center, page 266). In purifying the molten salt by using the apparatus shown in FIG. 6, the metal salt intended to purify is placed in a purification vessel 25 and melted by elevating the temperature of an electric furnace 29 for salt purification apparatus in a vacuum or while vacuumizing the inside of the purification vessel 25 from a gas discharge port and by further switching the system to an atmosphere of inert gas (e.g., argon gas) or reactive gas (e.g., hydrogen chloride gas). Thereafter, bubbling is performed for about 1 hour or more by blowing a reactive gas such as hydrogen chloride gas into the metal salt in a melted state from a gas inlet tube 24 through a porous filter 26. When bubbling is completed, the molten salt is transferred to a sample reservoir 27 by reducing the pressure on the gas inlet tube 24 side and, if desired, applying a pressure from the gas discharge port 23 side with use of an inert gas. After cooling, the sample reservoir 27 is put into a vacuum state and the top thereof is tightly sealed, whereby the purified sample is vacuum-enclosed and stored. In the case where the molten salt contains a heavy metal or the like unremovable by the above-described method, this salt is preferably further purified by a zone melt method.

The step of growing the Group 13 metal nitride crystal according to the production process of the invention is specifically described below. The step is described here by taking, as an example, the case where a Ga—Li alloy is used as the Group 13 metal alloy comprising a metal element of Group 13 and a metal element except for Group 13, an LiCl—KCl molten salt purified by the apparatus shown in FIG. 6 is used as the molten salt, and $Li_3N$ or $GaLi_3N_2$ is used as the nitride of the above-described metal element except for Group 13. The description in the following can apply to the case of selecting other materials.

FIG. 1 is a schematic view of a typical production apparatus used in practicing the invention. A Ga metal or a Ga—Li alloy 4 is charged into a reaction vessel 15 made of magnesium oxide and thereabove, a molten salt 7 having a low melting point such as purified LiCl or binary eutectic salt LiCl—KCl is charged. In this molten salt, $Li_3N$ or $GaLi_3N_2$ as the nitrogen source is dissolved to the saturated solubility. When the temperature of molten salt is lower than the melting point (813° C.) of $Li_3N$ or the melting point of $GaLi_3N_2$, the saturated solubility can be maintained by buoying a solid $Li_3N$ block 8 on the molten salt 7. In the case of $GaLi_3N_2$, the saturated solubility is maintained at the interface between the molten salt 7 and the Ga metal 5 by the effect of density. The $Li_3N$ block used here can be produced by dissolving and solidifying $Li_3N$ in a separate reaction vessel and grinding it. In the case of a nitride having a small density like $Li_3N$, if the density of the molten metal is extremely larger than the density (about 1.4 g/cm$^3$) of the $Li_3N$ block, the dissolved $Li_3N$ is distributed only above the molten salt and the $Li_3N$ concentration in the vicinity of interface with the Ga alloy is hardly elevated. Therefore, in the invention, a molten salt having a density slightly higher than that of $Li_3N$ is preferably selected and used. Usually, a molten salt having a density of approximately from 1.6 to 2.2 g/cm$^3$ is used. Incidentally, when the $Li_3N$ concentration in the molten salt is dispersed, the bath may be gently stirred.

In the Figure, 1 is a growing GaN crystal. The above-described molten salt intrudes into the interface between the GaN crystal 1 and the Ga alloy 4 to form a thin film-like nitrogen dissolved phase 14 and according to reaction formula (1), produces a GaN crystal with Ga in the Ga alloy, and the Li metal as a by-product is alloyed with the Ga metal.

The standard free energy $\Delta G_0$ in formula (1) is 42.5 kJ/mol (900 K) and in the standard state, the reaction places a disproportionate weight on the left side, but when the Li concentration in the Ga alloy is low, the reaction proceeds to the right side. Incidentally, this data is extracted from *Thermochemical Data of Pure Substances*, 2nd edition, published by VCH Verlagsgesellshaft mbH, D6940 Weinheim (Federal Republic of Germany) (1993). In reaction formula (1), when the activity $a_{Li}$ of Li in an equilibrium state at 900 K is determined, the result is about 0.15. This is calculated assuming that in formula (2), $\Delta G=0$ (equilibrium condition).

$$\Delta G = \Delta G_0 + RT \ln Kp \tag{2}$$

From $Kp = a_{Li3}a_{GaN}/a_{Li3N}a_G a$, $a_{Li} = \exp(-\Delta G_0/3RT)$.

As apparent from the Ga—Li binary phase diagram (Landolt-Bornstein, "Numerical Data and Functional Relationships in Science and Technology", New Series, (editor in chief: W. Marienssen), Group IV: Physical Chemistry, Volume 5, "Phase Equilibria, Crystallographic and Thermodynamic Data of Binary Alloys"), this system produces an intermetallic compound having a high melting point when the compositional ratio is 1:1. Therefore, the Li activity coefficient on the Ga high concentration side (Li low concentration side) is considered to be fairly small. In fact, in the activity chart set forth together with the above-described phase diagram, the Li activity is about 0.15 (activity coefficient: about 0.3) at 50 atm %-Li. The activity coefficient is considered to more decrease when the Li concentration is low, and take a figure of 0.01 at 10 atm %-Li or less. That is, the Li activity falls to well below $10^{-3}$. Accordingly, the reaction of formula (1) very swiftly proceeds with an extremely low Li activity at the initial stage of reaction, but when the Li concentration in the Ga alloy is increased along the reaction, the reaction is abruptly retarded and stops as the composition approaches 50 atm %-Li. In this way, the Li concentration in the Ga alloy greatly fluctuates according to the degree of progress of reaction and in turn, the reaction rate greatly fluctuates. In order to allow for stable growth of the crystal, such an unstable reaction rate is preferably avoided.

Figure 2:
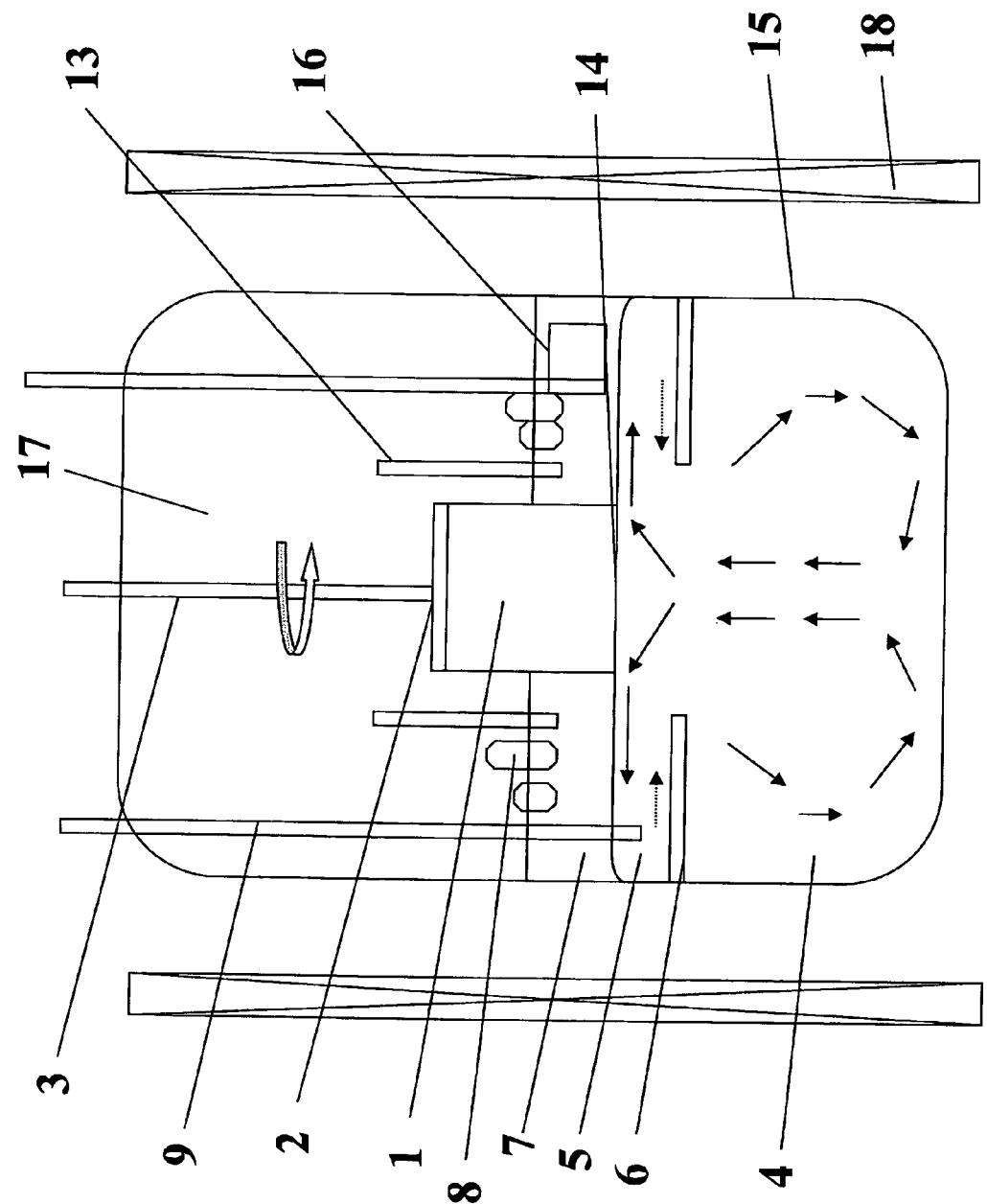
FIG. 2 is a schematic explanatory view showing a crystal growth apparatus (2 of 4) suitably used in the production of the Group 13 metal nitride crystal of the invention.

For this purpose, in the invention, the Li concentration is preferably controlled to a constant value by extracting Li produced in the Ga alloy with the progress of reaction. For example, the Li concentration can be controlled to a constant value by using the apparatus shown in FIG. 1 or 2. In the apparatus of FIG. 1, when the crystal 1 is rotated like the arrow in the Figure, the Ga alloy 4 beneath the crystal is moved toward the outer side by the centrifugal force and this causes the Ga alloy 4 to flow like the arrow in the vessel. At this time, when a partition plate 6 is provided in the vessel, the Ga alloy 4 near the inner wall of the vessel moves slowly in the portion above the partition plate 6, and the concentration of the Li metal produced according to formula (1) increases there. As a result, the Li activity is elevated near the inner wall of the vessel and the equilibrium of formula (1) is weighted on the left, so that excess GaN is prevented from being produced at the interface between the molten salt 7 and the Ga alloy 4 and put into a crust state. Furthermore, a carbon-made electrode 9 is inserted into the Ga alloy near the inner wall of the vessel and therefore, the alloy is anodically dissolved. Since Li is potentially more dissolvable than Ga, Li readily undergoes anodic dissolution and in the electrolysis bath 7, dissolves as ion and produces a metal Li on the cathode electrode 10. In FIG. 1, $Li_3N$ is produced in the bath by reacting a nitrogen gas 12 with the produced metal Li and again used as the nitrogen source. In FIG. 2, a liquid Ga or a solid or liquid Al is used as the cathode electrode 16 and the precipitated metal Li is alloyed with Ga or Al, whereby the metal Li is immobilized. On the other hand, in the thin film-like nitride-dissolved phase 14 formed as a result of intrusion of the molten salt into the interface between the GaN crystal 1 and the Ga alloy 4, the nitrogen source concentration decreases as the reaction proceeds and therefore, the nitrogen source must be supplied from the bath 7 of bulk. When the crystal growth rate is low, there arises no problem in the supply of nitrogen source, but when the growth rate is high, it is preferred to slightly move the crystal 1 up and down on the way of growth and thereby introduce a new electrolysis bath into the interface. By employing such means, the GaN crystal can be continuously grown.

Incidentally, the method for controlling the concentration of the produced metal Li is not limited to the electrochemical method shown in FIGS. 1 and 2. The metal Li in the Ga alloy may also be removed, for example, by taking the Ga alloy increased in the metal Li concentration out of the vessel and subjecting it to a treatment such as blowing of a hydrogen chloride gas or a halogen gas (e.g., chlorine gas).

Figure 3:
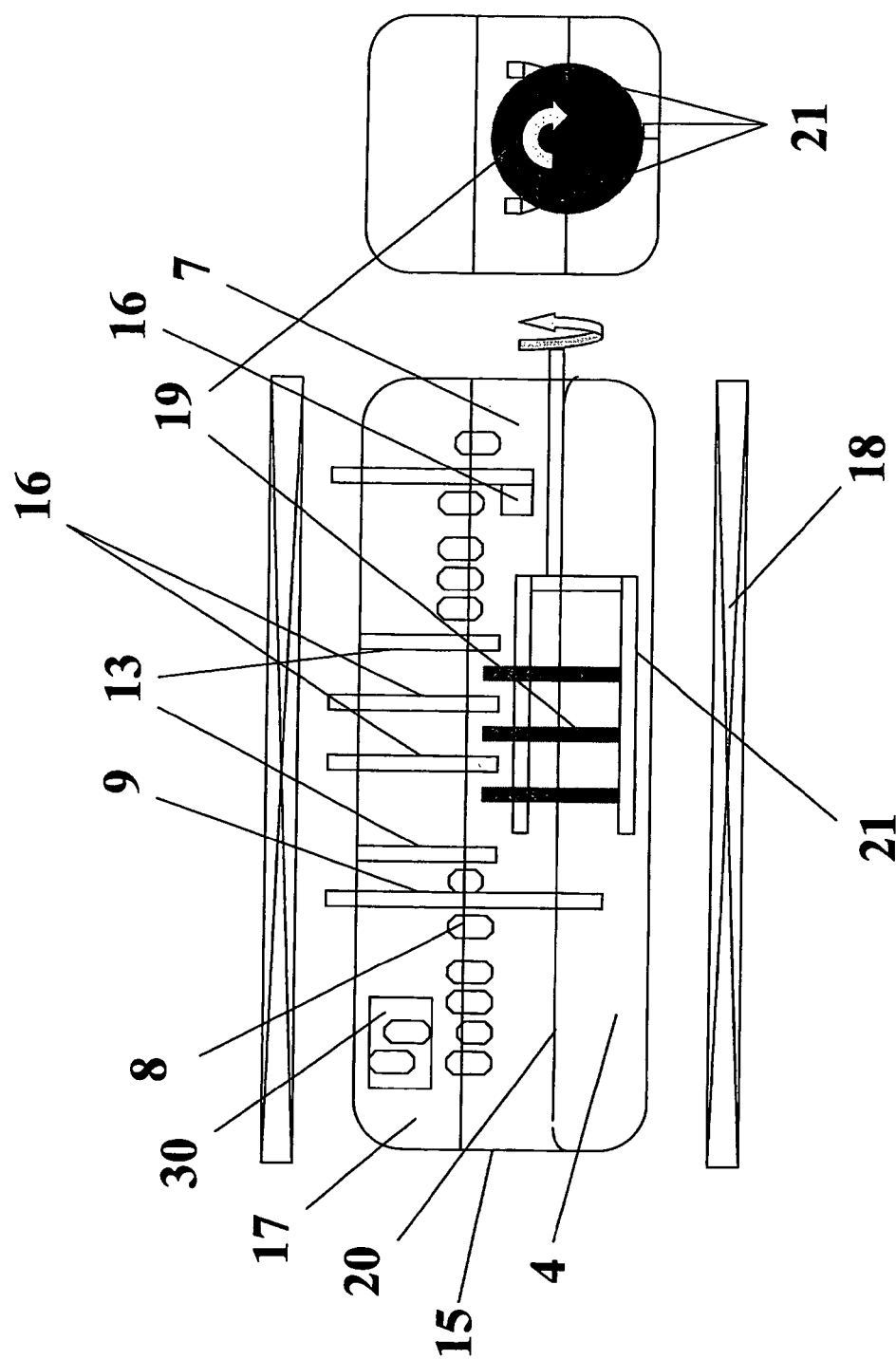
FIG. 3 is a schematic explanatory view showing a crystal growth apparatus (3 of 4) suitably used in the production of the Group 13 metal nitride crystal of the invention.

FIG. 3 shows a crystal growth apparatus in another mode suitably used for practicing the invention. A Ga—Li alloy 4 is charged into a magnesium oxide-made reaction vessel 15 and thereabove, a molten salt 7 having a low melting point, such as purified LiCl or binary eutectic salt LiCl—KCl, is charged. In the molten salt, $Li_3N$ or $GaLi_3N_2$ as the nitrogen source is dissolved to the saturated solubility. A plurality of disc-like substrates 19 are placed on a substrate holder 21 having a rotation axis nearly parallel to the interface 20 between those two liquid phases and by rotating the substrate holder, the plate-like substrate is caused to alternately contact with the molten salt 7 and the alloy 4. By employing such an operation, crystal growth occurs when the substrate passes through the interface 20 of those two liquid phases and/or when the molten salt 7 attached to the substrate surface intrudes into the alloy due to rotation of the substrate. In FIG. 3, the anode electrode 9 and the cathode electrode 16 are used for controlling the concentration of metal Li in the alloy 4. More specifically, when the Ga—Li alloy 4 is made to act as an anode, Li preferentially undergoes anodic dissolution and dissolves out as ion in the electrolysis bath 7. This Li ion is precipitated as a metal Li on the cathode 16 and alloyed. Accordingly, the composition of the Ga—Li alloy can be electrochemically controlled.

Incidentally, in order to cause the Li metal to undergo uniform anodic dissolution as an Li ion in the molten salt from the Ga alloy between substrates, it is effective to provide a cathode 16 between substrates. Furthermore, since the substrate usually has a structure of supporting the outer peripheral part, the cathode provided between substrates is preferably constituted to be movable in synchronization with the rotational motion so as not to colloid against the substrate holder 21 along the rotation of the substrate.

As for the substrate 19, for example, sapphire and SiC may be used, but a plate-like GaN crystal is preferably used. It is preferred to grow a crystal on both surfaces of a plate-like GaN crystal, prepare several sheets of the wafer, and use one of these sheets as the substrate for next crystal growth. In accordance with the growth of crystal, $Li_3N$ or $GaLi_3N_2$ as the nitrogen source may be appropriately refilled from the reservoir 30.

Figure 13:
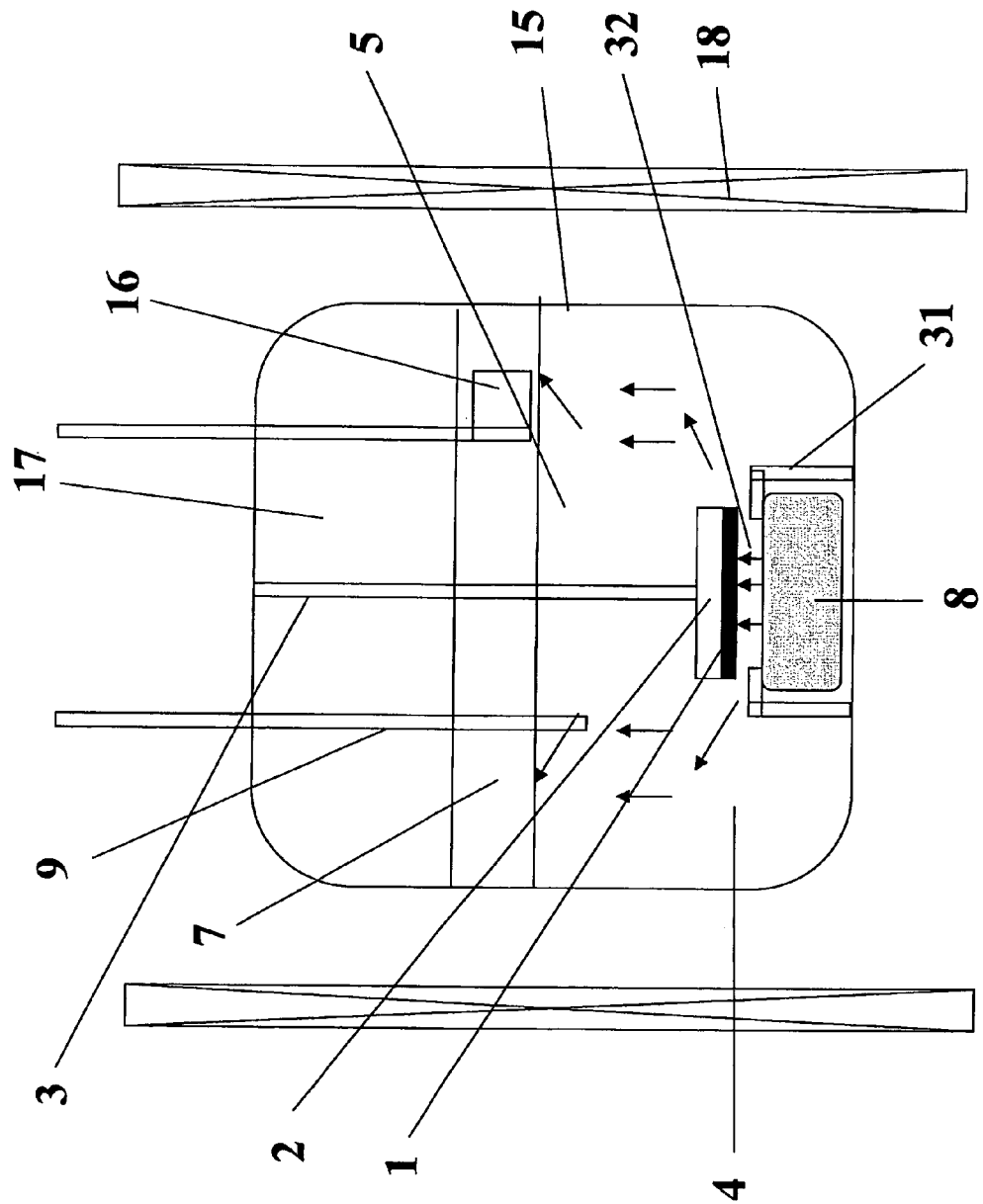
FIG. 13 is a schematic explanatory view showing a construction example of the production apparatus for the growth of a Group 13 metal nitride crystal.
Figure 14:
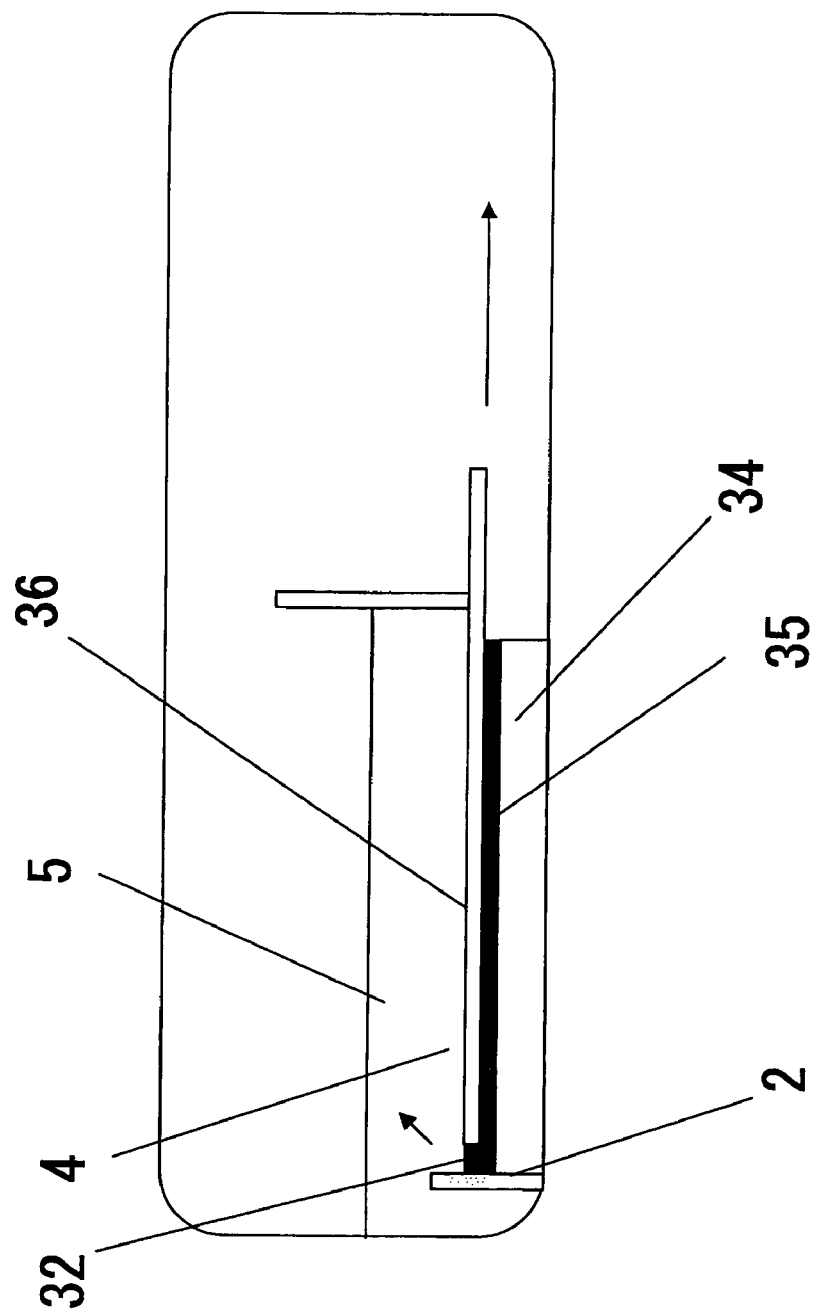
FIG. 14 is a schematic explanatory view showing a construction example of the production apparatus for the growth of a Group 13 metal nitride crystal.
Figure 15:
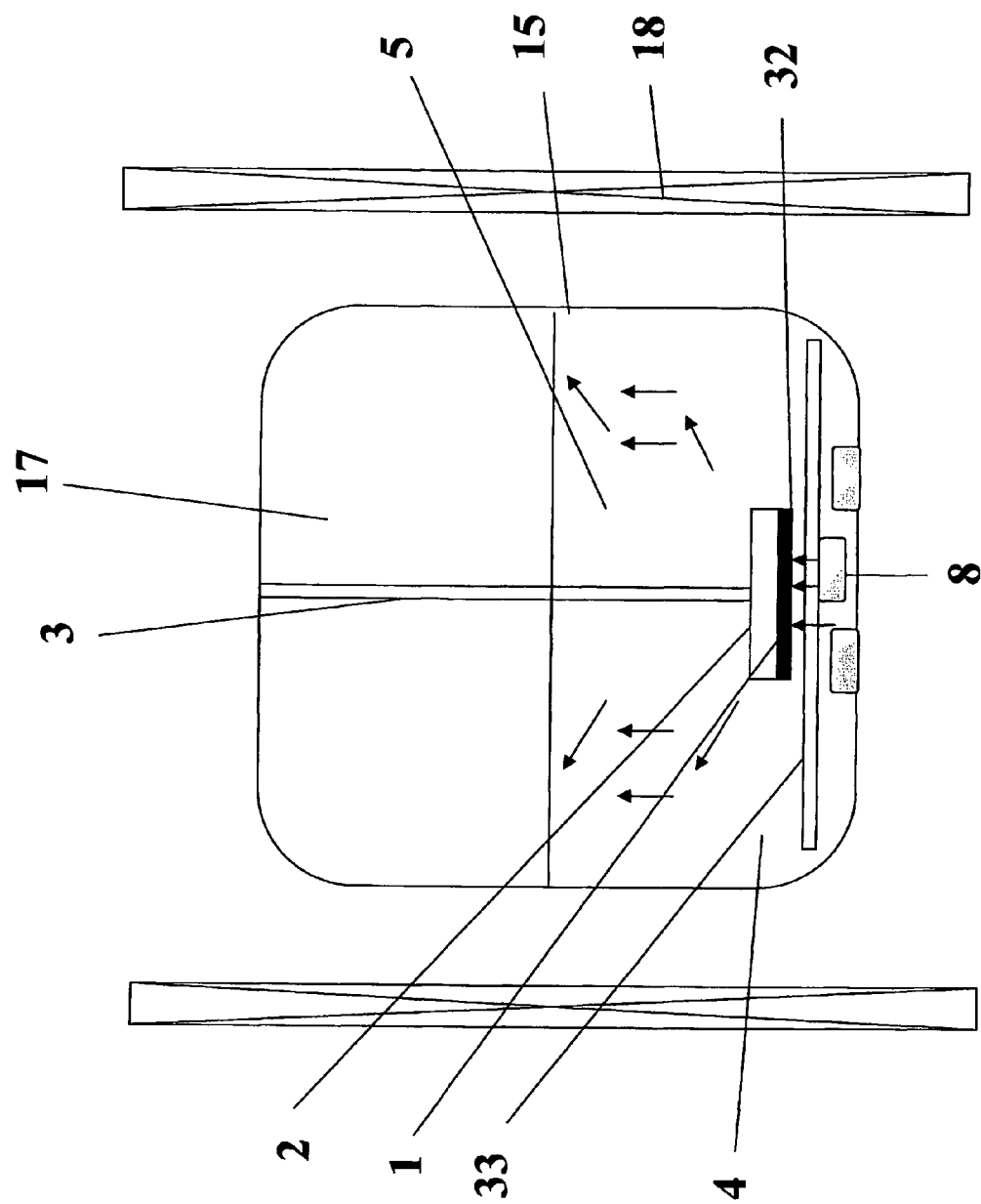
FIG. 15 is a schematic explanatory view showing a crystal growth apparatus (4 of 4) suitably used in the production of the Group 13 metal nitride crystal of the invention.

FIGS. 13 and 14 each shows an apparatus for use in producing a nitride-dissolved liquid phase in a Ga—Li alloy. A nitride 8 such as $GaLi_3N_2$ separately produced by using a physical process such as chemical or reactive sputtering is fixed in a vessel 31 made of magnesia, tungsten or the like and directly contacted with a Ga alloy to produce a nitride-dissolved liquid phase 32 in a liquid Ga metal. GaN produced according to formula (1)' epitaxially grows on a substrate 2 and Li is taken into an alloy phase 4. At this time, a substrate supporting bar 3 may be slowly rotated so as to accelerate the crystal growth. Incidentally, since the alloy phase 4 becomes a Ga—Li alloy when the reaction starts, the alloy phase may be initially a Ga metal simple body. As the Li concentration elevates and the density becomes small along the reaction, the alloy portion having a high Li concentration in the vicinity of the reaction field naturally shifts upward and when the Ga alloy amount is sufficiently large, the reaction continues without stopping and the Li concentration becomes high in the upper part 5 of the Ga alloy, so that a thin film-like GaN crystal or a small bulk-like crystal can be produced without artificially controlling the Li concentration. In order to largely grow GaN as a thick film or bulk, this may be attained, for example, by placing the molten salt 7 shown in FIG. 13 on the alloy 4, and anodically dissolving Li to cause the Li to move toward the cathode 16, thereby controlling the Li concentration in the alloy 4. The solid $GaLi_3N_2$ may be produced by sintering a GaN powder and an $Li_3N$ powder after adding thereto a slight amount of an appropriate flux, for example, an alkali halide (e.g., LiCl). Also, a method of first producing a Ga—Li alloy, treating it at 600 to 700° C. in a nitrogen atmosphere, grinding the produced $GaLi_3N_2$, adding a slight amount of an alkali halide, and sintering the powder is a simple and effective method.

In FIG. 14, a thin film 35 comprising a mixture (e.g., Ga—Li—N) is formed on a substrate 34 (e.g., quartz, sapphire, GaN) by using a dry process such as sputtering and contacted with a Ga metal 4 to produce a nitride-dissolved phase 34, and a GaN crystal is grown on the substrate 34. In the Figure, 36 is a partition plate for preventing a reaction between the nitride thin film 35 and the Ga metal 4 in the portion except for the crystal growth part, and examples of the material used therefor include tungsten.

The atmosphere 17 in the reaction vessel may be a nitrogen atmosphere, but the nitrogen atmosphere may have an adverse effect that a reaction with Li takes place at the interface with the Ga—Li alloy and the produced nitride reacts with Ga, as a result, GaN with poor crystallinity is readily produced. Therefore, in the invention, an atmosphere of inert gas such as Ar is preferred.

The produced GaN has a dissociation pressure of 1 atm at 650° C. as calculated from the free energy of production, and it is acknowledged in general that decomposition starts at a temperature 650° C. or more under atmospheric pressure. However, according to the invention, even at a temperature of 800° C. under atmospheric pressure, GaN in the alloy or molten salt is not decomposed into Ga metal and nitrogen gas or the like. Furthermore, as apparent from formula (1), the dissolution precipitation of GaN crystal can be controlled by the Li concentration in the Ga alloy and therefore, re-dissolution and recrystallization can be repeated at the solid-liquid interface for the crystal growth, as a result, a high-quality crystal can be obtained. In this way, the invention is remarkably useful.

[Production Method of Semiconductor Device]

The production process of the invention can be used for the step of producing a Group 13 metal nitride in the production method of a semiconductor device. With respect to the materials, production conditions and apparatus for other steps, the materials, conditions and apparatus for use in a general production method of a semiconductor device can be applied as-is.

The characteristic features of the invention are described in greater detail below by referring to Examples. The materials, amounts used, ratios, treatment contents, treatment procedure and the like described in the following Examples can be appropriately changed or modified without departing from the purport of the invention. Accordingly, the scope of the invention should not be construed as being limited to these specific examples.

EXAMPLE 1

Crystal growth of GaN was performed at the interface between a molten salt and a Ga—Li alloy by using the apparatus shown in FIG. 5 without use of a GaN seed crystal, a substrate or the like. About 4.6 g of a molten salt, about 0.6 g of $Li_3N$ and about 7 g of Ga—Li alloy (Li: about 3 atm %) were charged into a magnesium oxide-made reaction vessel (crucible) 15 and dissolved in a nitrogen atmosphere (under atmospheric pressure) In relation to the density, as shown in FIG. 5, a separated state into two phases of an upper phase part of molten salt 7 and a lower phase part of Ga—Li alloy 4 was created, and a block-like $Li_3N$ 8 in a state of buoying on the molten salt bath was dissolved to the saturated concentration. The $Li_3N$ used here was previously dissolved in a different crucible in a nitrogen atmosphere, solidified and then ground into a block shape. As for the molten salt, an LiCl—KCl binary salt (60/40 mol %) having a melting point of about 370° C. was used. The salts in the LiCl—KCl binary system were each independently purified by using the apparatus shown in FIG. 6 and after weighing for the sample, dissolved in a vacuum to prepare a mixed salt. The metal Li precipitated according to the reaction of formula (1) forms an alloy with a Ga metal and along the growth of GaN, the Li concentration was elevated. In order to keep constant this elevating Li concentration, an electrode 9 was inserted into the Ga—Li alloy to act as an anode, and Li of the alloy was anodically dissolved as ion in the molten salt 7. On the other hand, a cathode 16 containing a liquid Ga metal was inserted into the molten salt 7 and by precipitating Li ion and forming a Ga—Li alloy, the composition of Ga—Li alloy in the lower phase part was controlled.

Figure 7:
FIG. 7 is an optical microphotograph of the GaN crystal obtained in Example 1.
Figure 8:
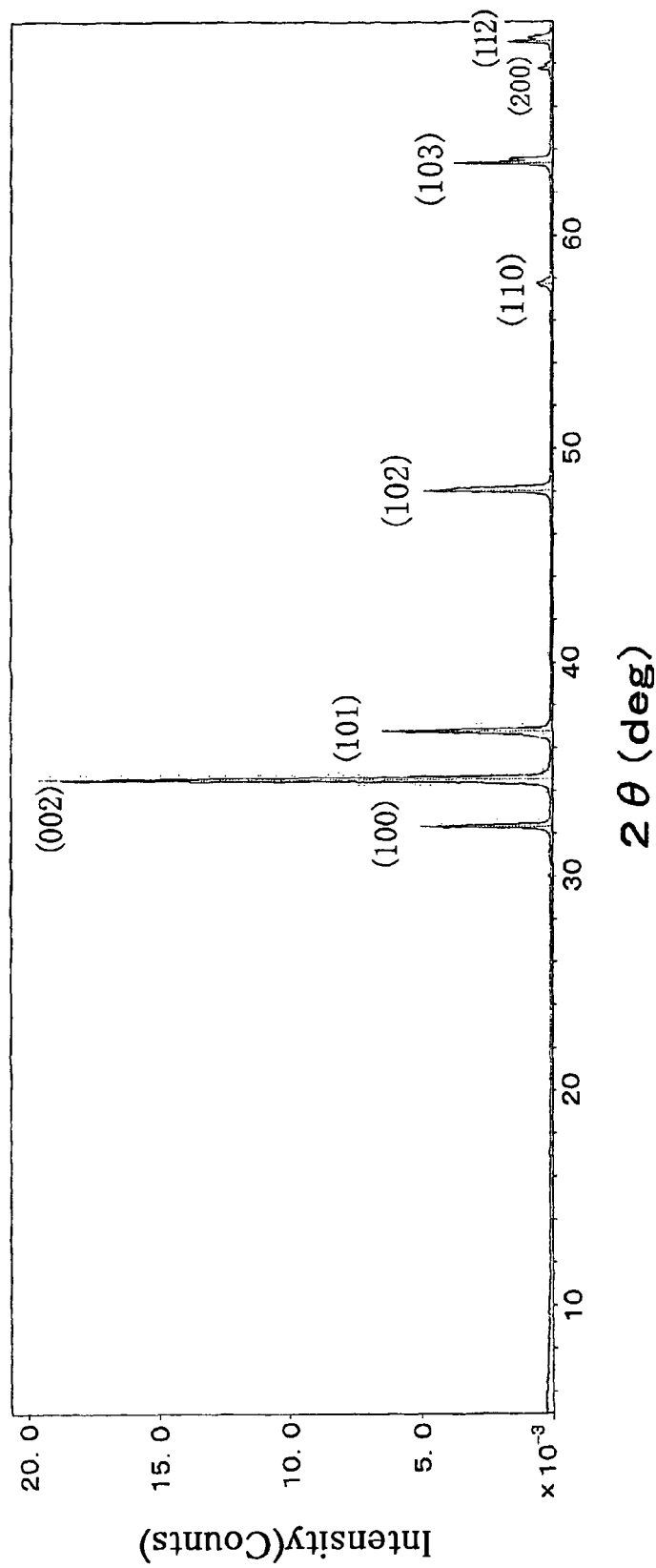
FIG. 8 is an X-ray diffraction data of the GaN crystal obtained in Example 1.

The internal temperature of the reaction vessel 15 was kept at about 780° C., and an electrolytic current of 40 mA was passed for 8 hours (quantity of electricity: about 1,000 coulomb). After the completion of test, the system was left standing and in this state, cooled to an ordinary temperature. In order to completely solidify the Ga alloy, the system was cooled with use of a liquid nitrogen and after separating the metal component, the contents in the crucible were dissolved out with concentrated hydrochloric acid. The Li concentration in the Ga—Li alloy 4 was, according to the ICP-AES standard addition method (Li), 3.2 atm % before the test and 4.3 atm % after the test, implying that the Li concentration fluctuation during the test was suppressed to about 1 atm %. Incidentally, since the intermetallic compound having a high melting point for the Ga—Li alloy was separated into two phases in the cooling process, the analysis was performed by uniformly dissolving the entire amount of these two phases. FIG. 7 is a microphotograph of the transparent crystalline powder (diameter: from 0.5 to 1 mm) taken out as above. As seen from FIG. 7, the crystal was spirally grown and since a flat plane was present on the C face, the growth is considered to have proceeded at the interface between the alloy 4 and the electrolysis bath 7. The density of the produced GaN is slightly larger than that of the Ga—Li alloy and this implies that when the system is left standing, the majority stays at the interface between the alloy 4 and the electrolysis bath 7 by the effect of surface tension. FIG. 8 shows an X-ray diffraction data. A large diffraction peak from (002) is characteristic and this reveals that C face is grown and the crystallinity is high.

The half-widths of representative diffraction peaks in the X-ray diffraction data of the obtained crystal are shown in Table 1.

EXAMPLE 2

Figure 9:
FIG. 9 is an optical microphotograph of the GaN crystal obtained in Example 2.
Figure 10:
FIG. 10 is an SEM photograph of the GaN crystal obtained in Example 2.

Crystal growth was performed under the same conditions as in Example 1 except that the current was changed to 20 mA and the time period of passing the current was prolonged to 16 hours (the quantity of electricity was about 1,000 coulomb and almost the same as in Example 1). Similarly to Example 1, a microphotograph of the obtained transparent powder (diameter: from 0.5 to 2 mm) and an SEM photograph are shown in FIGS. 9 and 10, respectively. The crystal was nearly the same as in Example 1 except for being planarly large. The Li concentration in the Ga—Li alloy was 2.9 atm % before the test and 4.8 atm % after the test.

Incidentally, the X-ray diffraction data was completely the same as in Example 1 and is not shown. The photographs shown in FIGS. 9 and 10 were taken by selecting portions having a similar form on the crystal grain surface but these are not photographs of the same place.

EXAMPLE 3

Figure 11:
FIG. 11 is an optical microphotograph of the GaN crystal obtained in Example 3.

Crystal growth was performed under the same conditions as in Example 1 except that the apparatus of FIG. 4 without an electrode was used and the electrolysis was not performed. The test time was 8 hours. FIG. 11 shows a microphotograph of the obtained white powder (diameter: less than 0.5 mm). The Li concentration in the Ga—Li alloy 4 was 3.1 atm % before the test and 13.7 atm % after the test and as compared with Examples 1 and 2 where electrolysis was performed, the Li concentration in the Ga—Li alloy 4 was greatly elevated and the size of the obtained powder crystal was small. In the X-ray diffraction data, the intensity ratio of diffraction peaks was almost the same as in Examples 1 and 2 but as seen from Table 1, the half-width of each peak was somewhat broad as compared with Examples 1 and 2, implying that the crystallinity was slightly worsened.

EXAMPLE 4

Figure 12:
FIG. 12 is an optical microphotograph of the GaN crystal obtained in Example 4.

Crystal growth was performed under the same conditions as in Example 3 except that the test time was prolonged to 16 hours. FIG. 12 shows a microphotograph of the obtained white powder crystal (diameter: less than 0.5 mm). Despite prolongation of the test time, the crystal size was not so large as compared with the crystal of Example 3. Also, the Li concentration in the Ga—Li alloy 4 was 3.3 atm % before the test and 14.1 atm % after the test and as compared with Examples 1 and 2 where electrolysis was performed, the Li concentration in the Ga—Li alloy 4 was greatly elevated. The half-widths of diffraction peaks in the X-ray diffraction date were, as seen in Table 1, somewhat broad as compared with Examples 1 and 2.

EXAMPLE 5

Crystal growth was performed under the same conditions as in Example 3 except that about 20 wt % of Mg was further added to the Ga—Li alloy. The obtained white powder (diameter: less than 0.5 mm) had a strong resemblance to that in the microphotograph (FIG. 11) of Example 3, and when the impurities in the crystal were measured and analyzed by inductively coupled plasma emission spectroscopy, mass spectrometry ICP-AES and QMS, Li was 0.0028 wt % and Mg was 0.65 wt %. The analysis results in Example 3 were Li of 0.0034 wt % and Mg of 0.0055 wt %, and it is revealed that Mg is doped in the crystal by adding it to the alloy.

Incidentally, the cause why a slight amount of Mg was detected also in the crystal produced in Example 3 is presumed to be MgO used in the crucible.

EXAMPLE 6

Figure 16:
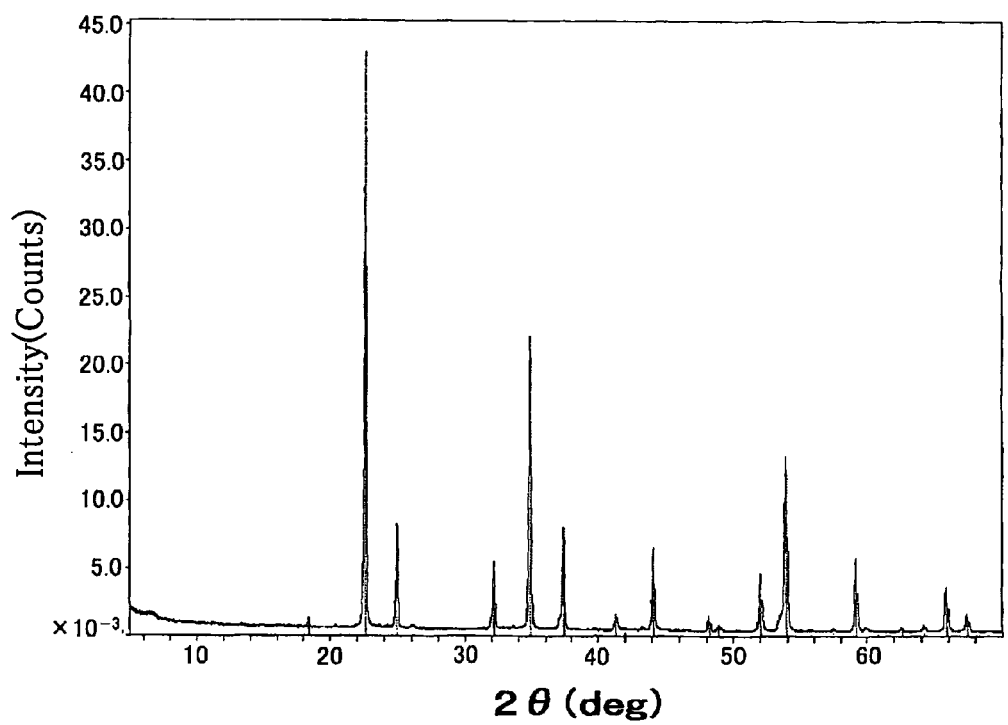
FIG. 16 is an X-ray diffraction data of the GaLi$_3$N$_2$ crystal obtained in Example 6.

Gallium nitride and lithium nitride reagents (produced by Mitsuwa Kagaku) were mixed in a crucible to a molar ratio of about 1:1, and about 2 g of the resulting mixture was charged into a magnesia-made crucible and heated at 800° C. for about 6 hours in a nitrogen atmosphere. The sample had a mixed color of gray and amaranth before the heating but turned to whitish gray after the heating. FIG. 16 shows the X-ray data of this sample and it is seen that $GaLi_3N_2$ was produced.

Figure 17:
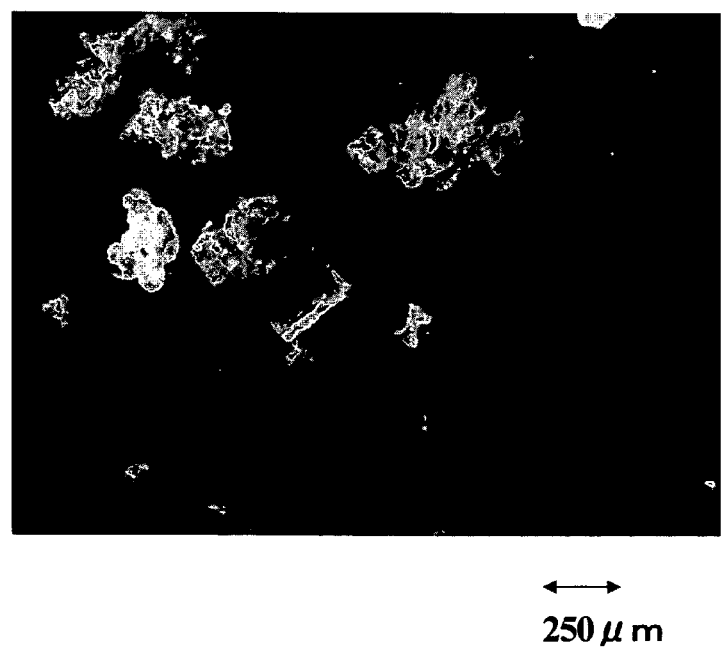
FIG. 17 is an optical microphotograph of the GaN crystal obtained in Example 6.

Almost the same test as in Example 3 was performed except that the thus-synthesized $GaLi_3N_2$ was used in place of $Li_3N$, the test temperature was changed to 740° C. in a nitrogen atmosphere and LiCl was used as the molten salt. The molten salt used was comprising 4.3 g of LiCl, 10.5 g of GaLi (Li: 3.2 atm %) alloy and 0.60 g of $GaLi_3N_2$. Incidentally, the test temperature was made lower than that in Example 3, because if the temperature is high, $GaLi_3N_2$ starts decomposing before it dissolves in the molten salt. Also, the amount of Ga was increased to about 10 g so as to alloy Li, that is a by-product in the reaction, with the Ga metal swiftly. It is considered that in relation to the density, $GaLi_3N_2$ charged into the crucible is, unlike $Li_3N$, present near the interface between the salt and the Ga metal but finally the majority dissolves in the bath and reacts with the Ga metal at the interface to produce GaN. The Li concentration in the Ga—Li alloy 4 was 3.2 atm % before the test and 8.4 atm % after the test. The Li concentration in the alloy is less elevated as compared with Example 3 using $Li_3N$ but as a result of progress of the reaction like formula (1)', the Li concentration in the Ga alloy seems to be elevated to bring about the production of GaN. An optical microphotograph of the GaN powder obtained in this test is shown in FIG. 17 and the half-widths in the X-ray data are show in Table 1. As compared with Example 3 using $Li_3N$, the crystallinity was rather good.

EXAMPLE 7

Figure 18:
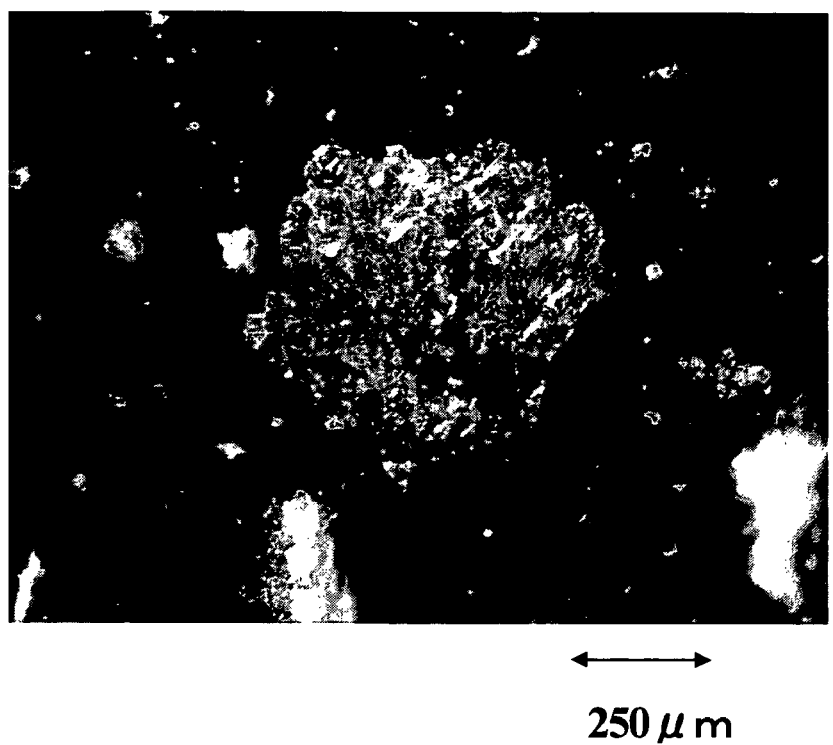
FIG. 18 is an optical microphotograph of the GaN crystal obtained in Example 7.

The same test as in Example 6 was performed except for using pure Ga in place of the Ga alloy and changing the nitrogen atmosphere to an argon atmosphere. The molten salt used was comprising 14.2 g of LiCl, 11.1 g of Ga metal and 0.62 g of $GaLi_3N_2$. The Li concentration in the Ga—Li alloy 4 was 3.2 atm % before the test, and the Li concentration in Ga after the test was 6.5 atm %. An optical microphotograph of the GaN powder obtained in this test is shown in FIG. 18 and the half-widths in the X-ray data are show in Table 1. Even when the atmosphere was changed to an atmosphere of inert gas other than nitrogen, many crystals having a shape resulting from complicated growth on the hexagonal plate-like crystal surface were observed. From the X-ray data, it is seen that a good crystal was obtained similarly to Example 6.

EXAMPLE 8

Figure 19:
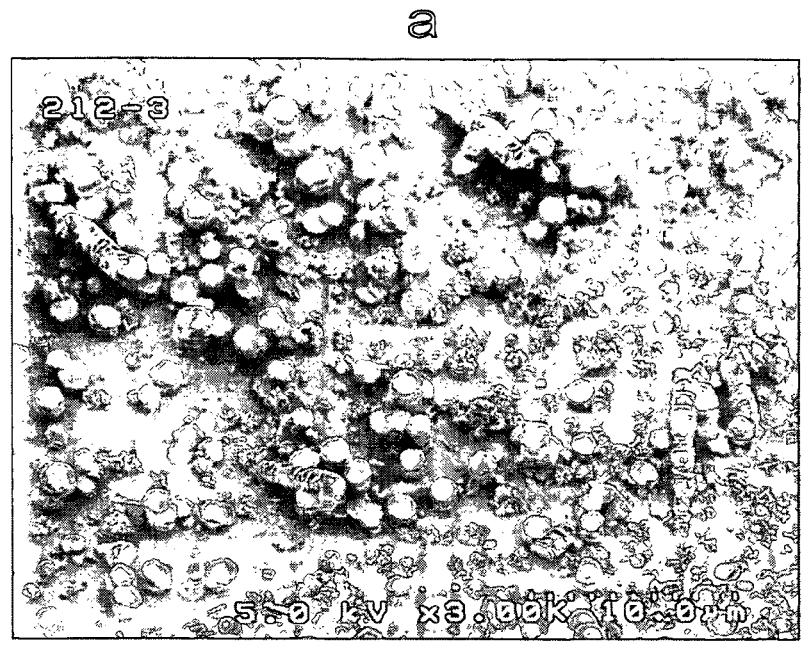
FIG. 19 is an SEM photograph of the GaN crystal obtained in Example 8.
Figure 19:
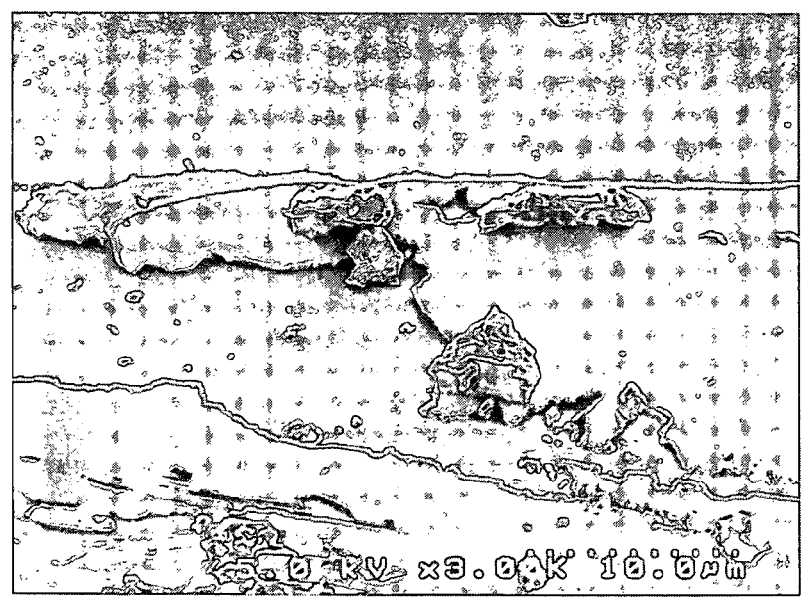

A test was performed using the $GaLi_3N_2$ produced in Example 6 and using the apparatus shown in FIG. 15. Particles 8 of $GaLi_3N_2$ were placed on the bottom of a magnesia crucible 15, a tungsten net 33 was put thereon to prevent the particle from floating up when a Ga—Li alloy 4 was charged, and a sapphire substrate produced through an MOCVD vapor phase process was placed on the tungsten net by arranging the substrate surface 1 with an GaN film to face downward. In this state, the system was left standing at 720° C. for 8 hours. As a result, GaLi$_3$N$_2$ gradually dissolved into the GaLi alloy 4, a Ga metal liquid phase 32 having dissolved therein GaLi$_3$N$_2$ was formed near the upper part of the tungsten net 33, and a reaction of formula (1)' with the Ga alloy phase 4 took place in the vicinity of the substrate 1. In this way, GaN was grown on the substrate 1. FIGS. 19a and 19b each is an SEM photograph of the thus-grown crystal. The surface of the sample was analyzed by EPMA, but elements other than Ga and N were not observed. Although a complete film was not formed, as shown in FIG. 19a, a hexagonal plate-like GaN crystal was grown with the C face up and as shown in FIG. 19b, a thin film-like portion was observed in some places despite incomplete formation.

TABLE 1

|  | Half-Width | | |
| --- | --- | --- | --- |
|  | 32.5° (100) | 34.5° (002) | 36.8° (101) |
| Example 1 | 0.136 | 0.156 | 0.173 |
| Example 2 | 0.136 | 0.156 | 0.173 |
| Example 3 | 0.143 | 0.173 | 0.182 |
| Example 4 | 0.141 | 0.171 | 0.179 |
| Example 6 | 0.135 | 0.156 | 0.175 |
| Example 7 | 0.136 | 0.154 | 0.174 |

As verified in these Examples, a good crystal can be obtained even without a seed crystal. This implies that when the activity, that is, concentration of Li in the Ga—Li alloy is controlled to an optimal range and crystal growth is performed by using the apparatus shown in FIGS. 1 to 3 in which a Group 13 metal nitride crystal or a substrate is employed to serve as a seed crystal, a thick bulk-like crystal can be grown.

INDUSTRIAL APPLICABILITY

According to the production process of a Group 13 metal nitride crystal of the invention, a Group 13 metal nitride crystal having a sufficiently large size for the application to a semiconductor device can be simply and easily produced by using an inexpensive apparatus. This production process can be utilized for the production of a frequency-capable semiconductor device which has been heretofore difficult to produce, and therefore, the invention provides a great advantage to the industry.

The invention claimed is:

1. A process for producing a Group 13 metal nitride crystal, comprising reacting a liquid phase (A) containing a metal element of Group 13 of the Periodic Table with any one phase (B) of liquid phase (b1), solid phase (b2) and liquid phase (b3) wherein
the liquid phase (b1) comprises a molten salt having dissolved therein a nitride containing a metal element except for Group 13 of the Periodic Table,
the solid phase (b2) and the liquid phase (b3) comprise a composite nitride containing a metal element of Group 13 of the Periodic Table and a metal element except for Group 13 of the Periodic Table to grow a Periodic Table Group 13 metal nitride crystal, and
the reaction is allowed to proceed while removing a by-product containing a metal element except for metals of Group 13 of the Periodic Table, which is produced by the reaction, from the reaction field.

2. The process for producing a Periodic Table Group 13 metal nitride crystal as claimed in claim 1, wherein said by-product is moved in said liquid phase (A) and thereby removed from said reaction field.

3. The process for producing a Periodic Table Group 13 metal nitride crystal as claimed in claim 1, wherein said liquid phase (A) can be alloyed with said by-product.

4. The process for producing a Periodic Table Group 13 metal nitride crystal as claimed in claim 1, wherein said liquid phase (A) and said liquid phase (b1) are reacted while maintaining a state that these liquid phases are separated from each other.

5. The process for producing a Periodic Table Group 13 metal nitride crystal as claimed in claim 1, wherein said liquid phase (A) and said liquid phase (b1) are reacted while allowing for alternate contact with these liquid phases.

6. The process for producing a Periodic Table Group 13 metal nitride crystal as claimed in claim 1, wherein said liquid phase (b3) is formed between said liquid phase (A) and said solid phase (b2).

7. The process for producing a Periodic Table Group 13 metal nitride crystal as claimed in claim 1, wherein said by-product is removed from said reaction field through said liquid phase (A) by an electrochemical reaction.

8. The process for producing a Periodic Table Group 13 metal nitride crystal as claimed in claim 7, wherein in the cathode reaction of said electrochemical reaction, said by-product is reacted with a nitrogen gas and thereby converted into a nitride.

9. The process for producing a Periodic Table Group 13 metal nitride crystal as claimed in claim 7, wherein in the cathode reaction of said electrochemical reaction, said by-product is alloyed with a metal element contained in the cathode electrode.

10. The process for producing a Periodic Table Group 13 metal nitride crystal as claimed in claim 1, wherein said by-product is removed from said liquid phase (A) by reacting said liquid phase (A) with a halogen or halide gas.

11. The process for producing a Periodic Table Group 13 metal nitride crystal as claimed in claim 1, wherein in the vicinity of said reaction field, said crystal is grown on the seed crystal surface or on a substrate.

12. The process for producing a Periodic Table Group 13 metal nitride crystal as claimed in claim 1, wherein said Group 13 metal nitride crystal is grown by using a vessel containing magnesium oxide or calcium oxide.

13. The process for producing a Periodic Table Group 13 metal nitride crystal as claimed in claim 1, wherein said metal element except for Group 13 of the Periodic Table is an alkali metal or an alkaline earth metal.

14. The process for producing a Periodic Table Group 13 metal nitride crystal as claimed in claim 7, wherein said molten salt is a metal halide.

15. The process for producing a Periodic Table Group 13 metal nitride crystal as claimed in claim 1, wherein said liquid phase (A) and/or said liquid phase (b1) contains a dopant element.

16. A method for producing a semiconductor device, comprising a step of producing a Group 13 metal nitride crystal by the production process claimed in claim 1.

* * * * *